US011532979B2

(12) United States Patent
Hashim

(10) Patent No.: US 11,532,979 B2
(45) Date of Patent: *Dec. 20, 2022

(54) DUAL SUPPLY LOW-SIDE GATE DRIVER

(71) Applicant: TEXAS INSTRUMENTS INCORPORATED, Dallas, TX (US)

(72) Inventor: Ahmed Essam Hashim, Gilbert, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/011,184

(22) Filed: Sep. 3, 2020

(65) Prior Publication Data

US 2020/0403491 A1 Dec. 24, 2020

Related U.S. Application Data

(63) Continuation of application No. 16/418,613, filed on May 21, 2019, now Pat. No. 10,797,579.

(Continued)

(51) Int. Cl.
*H02M 1/08* (2006.01)
*G05F 1/56* (2006.01)
(Continued)

(52) U.S. Cl.
CPC ................ *H02M 1/08* (2013.01); *G05F 1/56* (2013.01); *H02M 1/088* (2013.01); *H02M 1/0003* (2021.05); *H02M 3/1588* (2013.01)

(58) Field of Classification Search
CPC ...... H02M 1/08; H02M 1/088; H02M 3/1588; H02M 2001/0003; G05F 1/56
See application file for complete search history.

(56) References Cited

U.S. PATENT DOCUMENTS 5,166,538 A   11/1992  Norton
5,940,287 A    8/1999  Brkovic
(Continued)

FOREIGN PATENT DOCUMENTS

DE        4403309 A1     8/1995

OTHER PUBLICATIONS

PCT Search Report for Application No. PCT/US 2019/059316, dated Jan. 30, 2020.

(Continued)

*Primary Examiner* — Kyle J Moody
(74) *Attorney, Agent, or Firm* — Michael T. Gabrik; Charles A. Brill; Frank D Cimino

(57) ABSTRACT

A system including: a first regulator having a first input voltage and a first output voltage; a second regulator having a second input voltage and a second output voltage; a first driver circuit coupled to the first regulator and a switch, wherein the first driver circuit is configured to drive the switch based on the first output voltage; a second driver circuit coupled to the second regulator and the switch, wherein the second driver circuit is configured to drive the switch based on the second output voltage; a driver controller coupled to the first driver circuit and the second driver circuit, wherein the driver controller is configured to select one of the first driver circuit and the second driver circuit to drive the switch based on a control signal; and a switch node coupled to the switch, wherein a switch node voltage at the switch node is a function of the switch being turned on and off.

20 Claims, 5 Drawing Sheets

Related U.S. Application Data

(60) Provisional application No. 62/754,926, filed on Nov. 2, 2018.

(51) Int. Cl.
*H02M 1/088* (2006.01)
*H02M 3/158* (2006.01)
*H02M 1/00* (2006.01)

(56) References Cited

U.S. PATENT DOCUMENTS

| | | | |
|---|---|---|---|
| 6,249,111 | B1 | 6/2001 | Nguyen |
| 6,388,506 | B1 | 5/2002 | Voo |
| 10,797,579 | B2 * | 10/2020 | Hashim ............... H02M 3/156 |
| 2004/0130307 | A1 | 7/2004 | Dequina et al. |
| 2006/0061342 | A1 | 3/2006 | Bernacchia et al. |
| 2006/0186869 | A1 | 8/2006 | Telecco |
| 2008/0007241 | A1 | 1/2008 | Isham |
| 2008/0164765 | A1 | 7/2008 | Illegems |
| 2010/0013449 | A1 | 1/2010 | Miki |
| 2010/0079194 | A1 | 4/2010 | Zheng et al. |
| 2010/0156505 | A1 | 6/2010 | Strzalkowski |
| 2012/0235663 | A1 | 9/2012 | Bayerer et al. |
| 2013/0063121 | A1 | 3/2013 | Kasai |
| 2013/0063186 | A1 | 3/2013 | DeBeer et al. |
| 2014/0210445 | A1 | 7/2014 | Hasegawa |
| 2014/0266323 | A1 | 9/2014 | McIntosh et al. |
| 2016/0190926 | A1 | 6/2016 | Ni et al. |
| 2017/0083034 | A1 | 3/2017 | Yang et al. |
| 2018/0301306 | A1 | 10/2018 | Yang et al. |
| 2019/0199343 | A1 | 6/2019 | Araragi |

OTHER PUBLICATIONS

EP Search Report for Pat. Appln. No. 1979052.9, dated Jan. 12, 2021, 8 pages.

* cited by examiner

DUAL SUPPLY LOW-SIDE GATE DRIVER

CROSS-REFERENCE TO RELATED APPLICATIONS

This application claims priority to U.S. Provisional Application No. 62/754,926, filed Nov. 2, 2018 and to U.S. patent application Ser. No. 16/418,613, filed May 21, 2019, each of which are hereby incorporated by reference.

BACKGROUND

Power supplies and power converters are used in a variety of electronic systems. Electrical power is generally transmitted over long distances as an alternating current (AC) signal. The AC signal is divided and metered as desired for each business or home location, and is often converted to direct current (DC) for use with individual electronic devices or components. Modern electronic systems often employ devices or components designed to operate using different DC voltages. Accordingly, different DC-DC converters, or a DC-DC converter that supports a wide range of output voltages, are needed for such systems.

There are many different DC-DC converter topologies. The available topologies differ with regard to the components used, the amount of power handled, the input voltage(s), the output voltage(s), efficiency, reliability, size and/or other characteristics. One example DC-DC converter topology uses a secondary low voltage "BIAS" input that is driven by the output voltage or an auxiliary power supply. This option improves efficiency at the cost of additional components and increased topology size. Efforts to improve DC-DC converter topologies are ongoing.

SUMMARY

In accordance with one example of the disclosure, an automotive system comprises a first regulator configured to provide a first output voltage based on a first input voltage level. The system also comprises a second regulator configured to provide a second output voltage based on a second input voltage level. The system also comprises a first driver circuit coupled to the first regulator and a switch, wherein the first driver circuit is configured to drive the switch based on the first output voltage. The system also comprises a second driver circuit coupled to the second regulator and the switch, wherein the second driver circuit is configured to drive the switch based on the second output voltage. The system also comprises a driver controller coupled to the first driver circuit and the second driver circuit, wherein the driver controller is configured to select one of the first driver circuit and the second driver circuit to drive the switch based on a control signal. The system also comprises a switch node coupled to the switch, wherein a switch node voltage at the switch node is a function of the switch being turned on and off. The system also comprises a load coupled to the switch node.

In accordance with one example of the disclosure, a circuit comprises a first regulator configured to provide a first output voltage based on a first input voltage level. The circuit also comprises a second regulator configured to provide a second output voltage based on a second input voltage level, wherein the second input voltage level is lower than the first input voltage level. The circuit also comprises a first driver circuit coupled to the first regulator, wherein the first driver circuit is configured to provide a first gate drive signal based on the first output voltage. The circuit also comprises a second driver circuit coupled to the second regulator, wherein the second driver circuit is configured to provide a second gate drive signal based on the second output voltage. The circuit also comprises a driver controller coupled to the first driver circuit and the second driver circuit. The circuit also comprises a drive signal node coupled to an output node of the first driver circuit and an output node of the second driver circuit, wherein the driver controller is configured to select between the first driver circuit and the second driver circuit to provide a respective gate drive signal to the drive signal node.

In accordance with one example of the disclosure, a dual supply gate driver comprises a first regulator circuit coupled to a first input voltage node. The dual supply gate driver also comprises a second regulator circuit coupled to a second input voltage node. The dual supply gate driver also comprises a first driver circuit coupled to an output node of the first regulator circuit. The dual supply gate driver also comprises a second driver circuit coupled to an output node of the second regulator circuit. The dual supply gate driver also comprises a driver controller coupled to the first driver circuit and the second driver circuit. The dual supply gate driver also comprises a drive signal node coupled to an output node of the first driver circuit and an output node of the second driver circuit.

BRIEF DESCRIPTION OF THE DRAWINGS

For a detailed description of various examples, reference will now be made to the accompanying drawings in which.

DETAILED DESCRIPTION

Described herein are dual supply gate driver topologies and related systems. In some examples, a dual supply gate driver includes a first regulator circuit coupled to a first input voltage node, and a second regulator circuit coupled to a second input voltage node. The dual supply gate driver also includes a first driver circuit coupled to an output node of the first regulator circuit. The dual supply gate driver also includes a second driver circuit coupled to an output node of the second regulator circuit. The dual supply gate driver also includes a driver controller coupled to the first driver circuit and the second driver circuit. The dual supply gate driver also includes a drive signal node coupled to an output node of the first driver circuit and an output node of the second driver circuit.

In some examples, a dual supply gate driver is commercialized as a stand-alone integrated circuit (IC) or chip. In other examples, a dual supply gate driver is combined with other circuits (e.g., a power switch and/or sense switch of a converter circuit, a load) in an IC, chip, a multi-die module (MDM), or a printed circuit board (PCB). With the disclosed dual supply gate driver topologies, the drive signal for the switch of a switching converter is efficiently provided without an external capacitor (for providing the drive current). In some examples, a dual supply gate driver is used to drive a low-side switch of a switching converter while providing efficiency, small size, and low cost compared to other gate drivers. To provide a better understanding, various dual supply gate driver options and related issues are described using the figures as follows.

Figure 1:
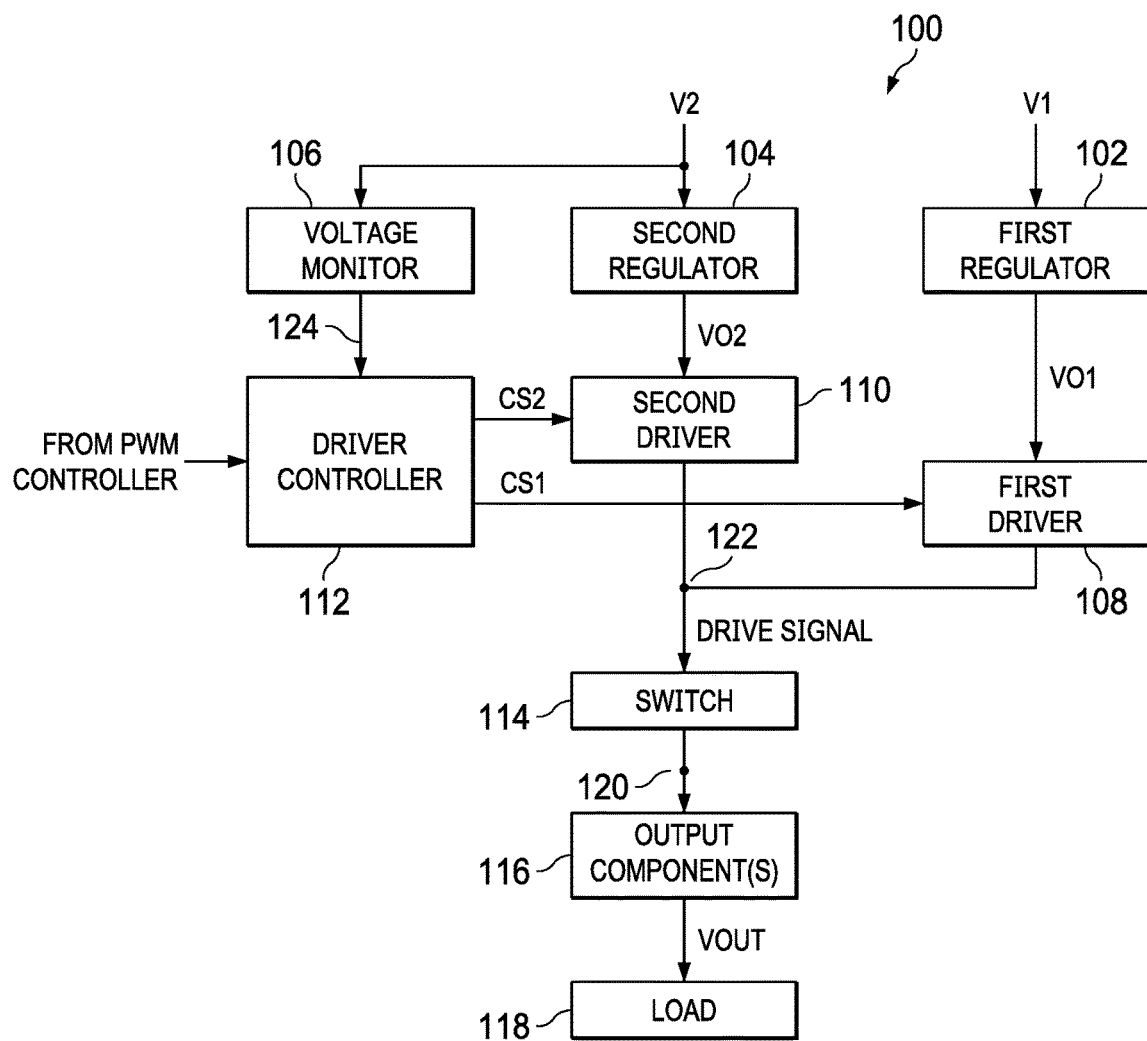
FIG. 1 is a block diagram showing a system in accordance with some examples.

FIG. 1 is a block diagram showing a system 100 in accordance with some examples. As shown, the system 100 comprises a first regulator circuit 102 and a second regulator circuit 104. The first regulator circuit 102 receives a first input voltage (V1) and provides a first output voltage (VO1) based on V1. The second regulator circuit 104 receives a second input voltage (V2) and provides a second output voltage (VO2) based on V2. As shown, VO1 is provided to a first driver circuit 108. When directed by a driver controller 112, the first driver circuit 108 is configured to provide a drive signal based on VO1 to a switch 114. Meanwhile, when directed by the driver controller 112, the second driver circuit 110 is configured to provide a drive signal based on VO2 to the switch 114.

In some examples, the driver controller 112 selects the first driver circuit 108 or the second driver circuit 110 to provide the drive signal to the switch 114 based on a signal 124 from the voltage monitor circuit 106. Also, a signal (e.g., the SWITCH ON signal in FIG. 5) from a PWM controller (not shown) is used to determine when the driver controller 112 asserts CS1 or CS2. In the example of FIG. 1, the voltage monitor circuit 106 is configured to monitor V2. When the signal 124 indicates that V2 is greater than a threshold, the driver controller 112 selects the second driver circuit 110 (using control signal "CS2") to provide the drive signal to the switch 114. On the other hand, when the signal 124 indicates that V2 is less than or equal to the threshold, the driver controller 112 selects the first driver circuit 108 (using control signal "CS1") to provide the drive signal to the switch 114.

In the example of FIG. 1, the drive signal is provided to the switch 114 via a drive signal node 122. In some example, the drive signal node 122 corresponds to an output pin for a dual supply gate driver IC or chip that includes the first regulator circuit 102, the second regulator circuit 104, the voltage monitor circuit 106, the first driver 108, the second driver 110, and the driver controller 112.

The on/off operations of the switch 114 changes the voltage at node 120, which corresponds to a switch node. In the example of FIG. 1, output component(s) 116 are coupled to the node 120. Examples of the output component(s) 116 include an output inductor and an output capacitor. Coupled to the output component(s) 116 is a load 118 powered by an output voltage (VOUT) that is based on the operations of the switch 114. In some examples, the system 100 corresponds to an automotive system. In such case, the first regulator circuit 102 receives V1 (e.g., 5V-40V) from a battery or conditioning components (e.g., filters and/or regulators). Meanwhile, V2 may be a bias voltage based on VOUT or a lower voltage auxiliary supply. In some examples, dual supply gate driver components of FIG. 1 are part of a buck converter or buck converter controller to direct low-side switching operations, where VOUT is smaller than V1. Example VOUT levels include 5V, 3.3V, 1.8V, or 1.2V. As desired, multiple switching converters are used in an automotive system or other electrical systems to power different loads with different input voltage requirements. Example loads for an automotive system include, but are not limited to, microprocessors, sensors, actuators, displays, an infotainment interface, and an intelligent power module (IPM). With the dual supply gate drive topology of FIG. 1, drive signal efficiency is higher with small chip size and low cost compared to other gate drive topologies that only use V1, or that use an external capacitor for drive signal generation.

Figure 2:
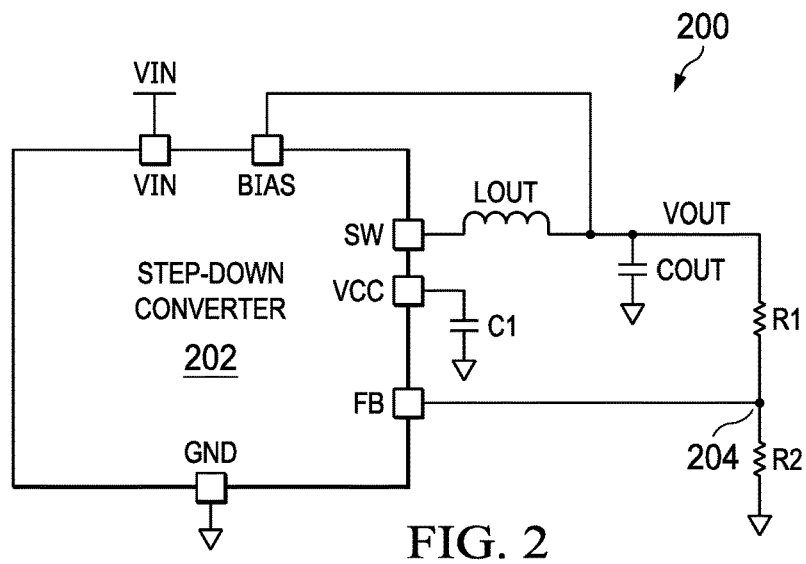
FIG. 2 is a schematic diagram showing a buck converter system in accordance with some examples.

FIG. 2 is a schematic diagram showing a buck converter system 200 in accordance with some examples. As shown, the buck converter system 200 includes a step-down converter circuit 202 with an input supply voltage (VIN) node, a bias node, a switch (SW) node, a voltage supply (VCC) node, a feedback (FB) node. More specifically, the SW node of step-down converter circuit 202 is coupled to the first end of an output inductor (LOUT). The second end of LOUT is coupled to the first (e.g., top) plate of an output capacitor (COUT). The second (e.g., bottom) plate of COUT is coupled to a ground node. In the example of FIG. 2, VOUT for the buck converter system 200 is provided to load (not shown) and a voltage divider formed using R1 and R2. The node 204 between R1 and R2 is coupled to the FB node for the step-down converter circuit 202. The step-down converter circuit 202 also receives VOUT at the bias node. In contrast to the system 100 of FIG. 1, the buck converter system 200 of FIG. 2 includes an external capacitor (C1) coupled to the VCC node of the step-down converter circuit 202, where VCC is the driver supply.

Figure 3:
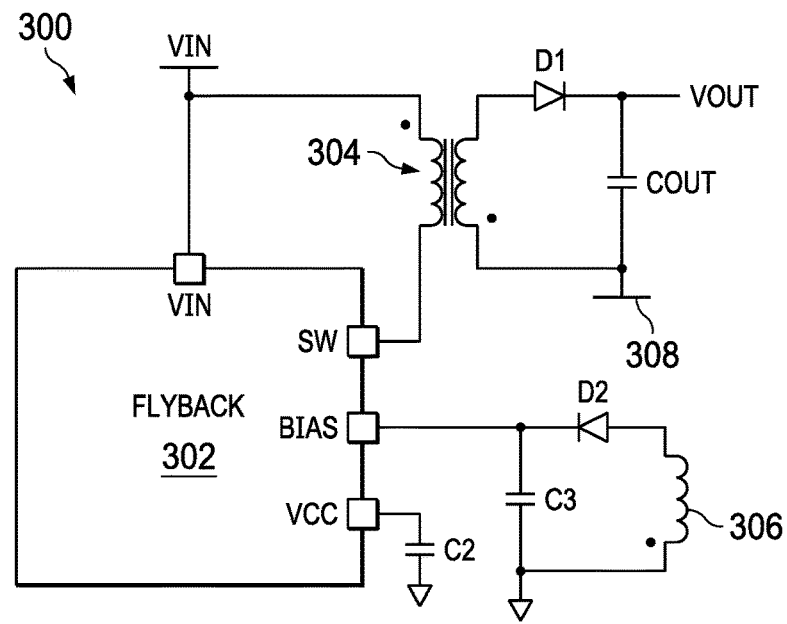
FIG. 3 is a schematic diagram showing a flyback converter system in accordance with some examples.

FIG. 3 is a schematic diagram showing a flyback converter system 300 in accordance with some examples. As shown, the flyback converter system 300 includes a flyback converter circuit 302 with an input supply voltage (VIN) node, a switch (SW) node, a bias node, and a VCC node. More specifically, the switch node is coupled to a transformer 304. A first winding of the transformer 304 is coupled between an input supply voltage (VIN) and the SW node. A second winding of the transformer 403 is coupled between another voltage supply node 308 and the anode of a diode (D1). The cathode of D1 is coupled to the first (e.g., top) plate of an output capacitor (COUT). The second (e.g., bottom) plate of COUT is coupled to a voltage supply node 308 and the second winding.

In the example of FIG. 3, the bias node is coupled to a circuit that includes a bias coil 306 inductively coupled to the transformer 304. As shown, the third winding 306 is coupled between a ground node and the anode of another diode (D2). The cathode of D2 is coupled to the bias node of the flyback converter circuit 302. Also, the first (e.g., top) plate of a capacitor (C3) is coupled to the cathode of D2 and to the bias node. The second (e.g., bottom) plate of C3 is coupled to a ground node. In contrast to the system 100 of FIG. 1, the flyback converter system 300 includes an external capacitor (C2) coupled to the VCC node of the flyback converter circuit 302. More specifically, the first (e.g., top) plate of C2 is coupled to the VCC node of the flyback converter 300, and the second (e.g., bottom) plate of C2 is coupled to a ground node.

With the step-down converter 200 of FIG. 2, the bias voltage is driven by the output voltage. In contrast, with the flyback converter 300 of FIG. 3, the bias voltage is driven by the bias winding 306. In either case, the bias voltage provided to the step-down converter circuit 202 or the flyback converter circuit 302 can improve efficiency by diverting the chip bias current from VIN to a lower voltage supply that is efficiently generated. In some examples, a low-side switch driver runs off of VCC, which is a regulated supply derived from either VIN or the bias voltage when available. Once the bias voltage exceeds a minimum required voltage, the VCC regulator will run all the driver current from the bias voltage.

Figure 4:
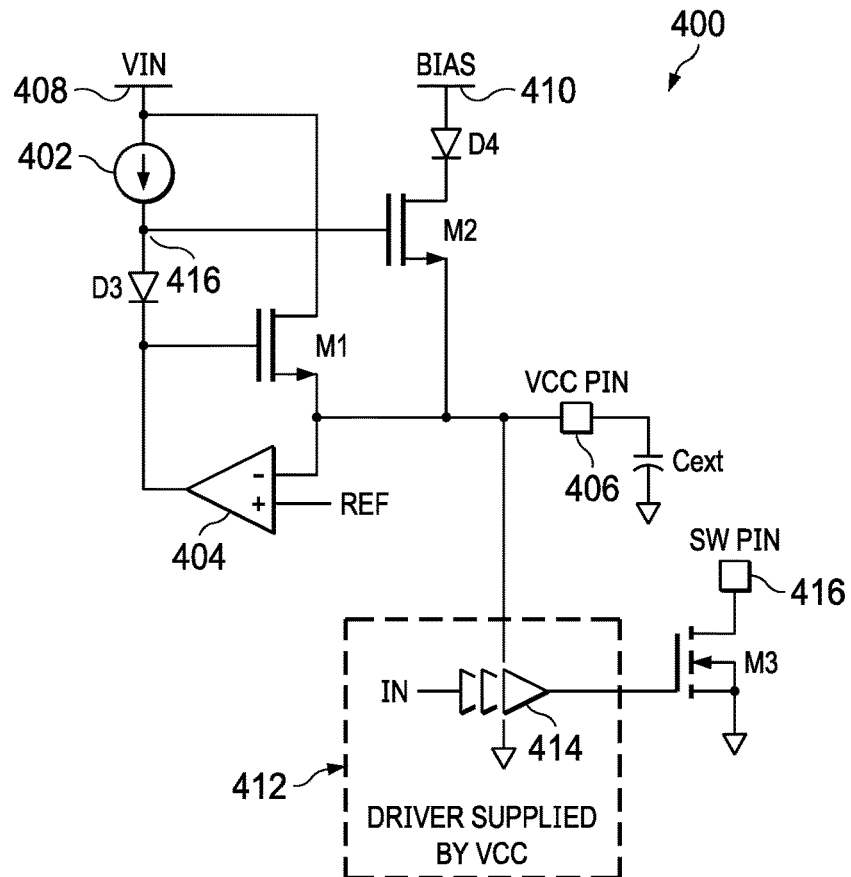
FIG. 4 is a schematic diagram showing a voltage regulator for a low-side switch driver in accordance with some examples.

FIG. 4 is a schematic diagram showing a voltage regulator 400 for a low-side switch driver in accordance with some examples. As shown, the voltage regulator 400 comprises a current source 402 coupled to a VIN node 408. The voltage regulator 400 also includes a transistor (M1) with a control terminal, a first current terminal, and a second current terminal. Also, the voltage regulator 400 also includes a diode (D3), where the anode of D3 is coupled to the current source 402, and the cathode of D3 is coupled to the control terminal of M1. Meanwhile, the first current terminal of M1 is coupled to the VIN node 408. Also, the second current terminal of M1 is coupled to the input node of a comparator 404. The other input node of the comparator 404 is a voltage reference (Ref), and the output of the comparator 404 is coupled to cathode of D3 and the control terminal of M1. As shown, the second current terminal of M1 is also coupled to a driver circuit 412 powered by the charge stored by an external capacitor (Cext) coupled to a VCC pin 406 (e.g., the VCC node of FIG. 2 or 3). As shown, the driver circuit 412 includes a series of inverters 404, where the charge stored by Cext is provided to the inverters 414.

In the example of FIG. 4, Cext is charged by the voltage at the VIN node 408 through M1, or from a bias node 410 through a transistor (M2). As shown, M2 includes a control terminal coupled to a node 416 between the current source 402 and the anode of D3. Also, the first current terminal of M3 is coupled to the bias node 410 via a diode (D4), where the anode of D4 is coupled to the bias node 410 and the cathode of D4 is coupled to the first current terminal of M2. The second current terminal of M2 is coupled to the driver circuit 412, the VCC pin 406, and the first (e.g., top) plate of Cext. The second (e.g., bottom) plate of Cext is coupled to a ground node.

In the example of FIG. 4, the voltage regulator 400 also includes a transistor (M3) coupled between the driver circuit 412 and a switch node (SW) pin 416. As shown, the control terminal of M3 is coupled to an output of the driver circuit 412. Also, the first current terminal of M3 is coupled to the SW pin 416. Also, the second current terminal of M3 is coupled to a ground node.

In some examples, the driver circuit 412 is a low-side switch driver that runs off of VCC, which is a regulated supply derived from either the VIN voltage or the BIAS voltage when present. Once the BIAS voltage exceeds a minimum required voltage, the VCC regulator will run all the driver current from BIAS voltage. Cext is needed to ensure that the VCC rail remains well-regulated when the driver 412 switches and pulls very high peak currents from the VCC rail.

Figure 5:
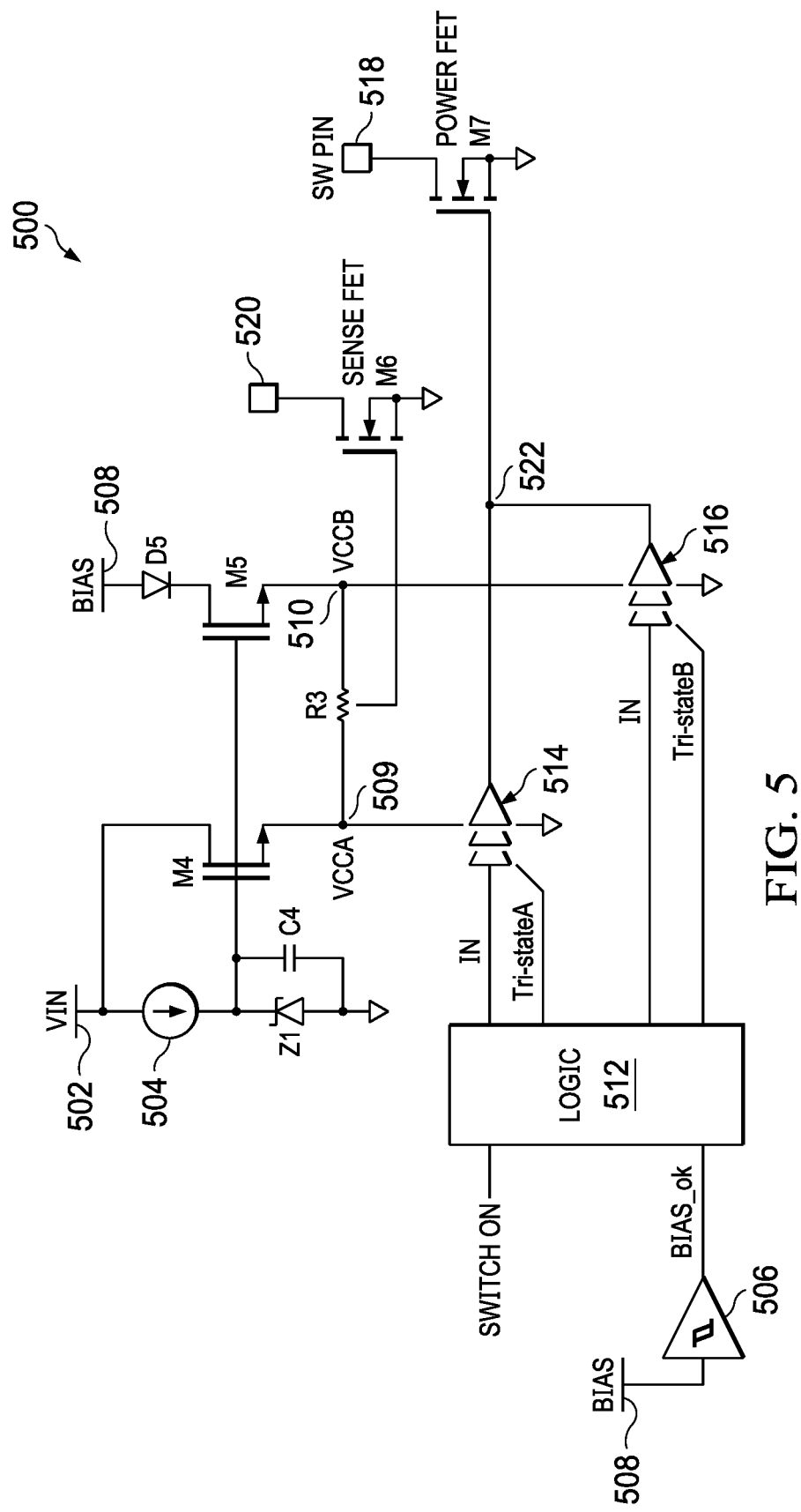
FIG. 5 is a schematic diagram showing a dual supply gate driver in accordance with some examples.

FIG. 5 is a schematic diagram showing a dual supply gate driver circuit 500 in accordance with some examples. As shown, the dual supply gate driver circuit 500 comprises a first driver circuit 514 and a second driver circuit 516, where the output nodes of the first driver circuit 514 and the second driver circuit 516 are coupled to a drive signal node 522. In the example of FIG. 5, a power transistor (M7) has its control terminal coupled to the drive signal node 522. Also, the first current terminal of M7 is coupled to a switch node (SW) pin 518, and the second current terminal of M7 is coupled to a ground node.

In some examples, the dual supply gate driver circuit 500 comprises a single IC with driver components (e.g., the first and second driver circuits 514 and 516), driver control components (e.g., the controller logic 512 and other components), and a power transistor (e.g., M7). In other examples, the components represented for the dual supply gate driver circuit 500 correspond to multiple ICs (e.g., M7 is part of a first IC, while the driver components and driver control components are part of a second IC).

In the example of FIG. 5, the operations of the controller logic 512 (an example of the driver controller 112 in FIG. 1) for the dual supply gate driver circuit 500 are based on a control signal ("Switch ON") and a bias voltage level indicator signal ("BIAS_ok"). In some examples, the BIAS_ok signal is provided by a comparator 506, where the output of the comparator 506 indicates when the BIAS voltage at node 508 is greater than a threshold. When the BIAS voltage at node 508 is greater than the threshold, the controller logic 512 selects the second driver circuit 516 using a control signal ("Tri-stateB"), where the input signal (IN) to the second driver circuit 516 is buffered using a voltage supply signal (VCCB) based on the BIAS voltage available at node 508. In the example of FIG. 5, VCCB is provided via a transistor (M5) having its first current terminal coupled to the node 508 via a diode (D5), which blocks the reverse path back to node 508 on start-up. If diode drop of D5 is too much, another option is to use a switch across D5, where the switch is closed when the BIAS voltage is sufficiently high. With the switch across D5, a lower BIAS voltage may be used. More specifically, the anode of D5 is coupled to the node 508 and the cathode of D5 is coupled to the first current terminal of M5. Also, the second current terminal of M5 is coupled to a VCCB node 510. Also, the control terminal of M5 is coupled to a current source 504 powered by the VIN voltage at node 502. As shown, the control terminal of the M5 is also coupled to the first end of a Zener diode (Z1) and the first (e.g., top) plate of a capacitor (C4). The second (e.g., bottom) plate of C4 and the second of Z1 are coupled to a ground node. With the arrangement of FIG. 5, the voltage level at the VCCB node 510 is based on the BIAS voltage at node 508 and is provided to the second driver circuit 516. When the BIAS voltage is sufficiently high, the controller logic 512 uses the second driver circuit 516 to provide the drive signal for M7.

When the BIAS voltage at node 508 is equal to or less than the threshold, the controller logic 512 selects the first driver circuit 514 using a control signal ("Tri-stateA"), where the input signal (IN) to the first driver circuit 514 is buffered using a voltage supply signal (VCCA) based on the VIN voltage available at node 502. In the example of FIG. 5, VCCA is provided via a transistor (M4) having its first current terminal coupled to the node 502. Also, the second current terminal of M4 is coupled to a VCCA node 509. Also, the control terminal of M4 is coupled to the current source 504 powered by the VIN voltage at node 502. As shown, the control terminal of the M4 is also coupled to Z1 and the first (e.g., top) plate of C4. In at least some examples, M4 provides the same amount of current flow, but can handle a higher voltage relative to M5. The second (e.g., bottom) plate of C4 and the second of Z1 are coupled to a ground node. With the arrangement of FIG. 5, the voltage level at the VCCA node 509 is based on the VIN voltage at node 502 and is provided to the first driver circuit 514. When the BIAS voltage is not sufficiently high, the controller logic 512 uses the first driver circuit 514 to provide the drive signal for M7. With the arrangement of FIG. 5, the dual supply gate driver circuit 500 increases complexity compared to a single driver arrangement with the benefit of reducing power consumption (by using the BIAS voltage for power driver operations when the BIAS voltage is sufficiently high) for low-side switch drive operations. Also, the dual supply gate driver circuit 500 eliminates an external capacitor (to maintain VCC) and IC compared to other driver solutions.

Another component represented in FIG. 5 is a sense transistor (M6). As shown, the control terminal for M6 is coupled to a resistor (R3) between the VCCA node 509 and the VCCB node 510. In some examples, R3 corresponds to two resistors coupled in series, where the middle node is coupled to the of M6. With R3, the control terminal for M6 receives an average of the voltage levels at VCCA and VCCB. Meanwhile, the second current terminal for M6 is coupled to a ground node, and the first current terminal for M6 is coupled to a sense node 520. In different examples, the sense node 520 provides a signal used for feedback control and/or monitoring operations of a switching converter. In one example, the signal at the sense node 520 is provided to a pulse-switch modulation (PWM) controller coupled to the driver controller 112 of FIG. 1. For example, a PWM controller may use the signal at the sense node 520 to adjust a duty cycle and/or timing of the SWITCH_ON signal provided to the logic 512.

Figure 6:
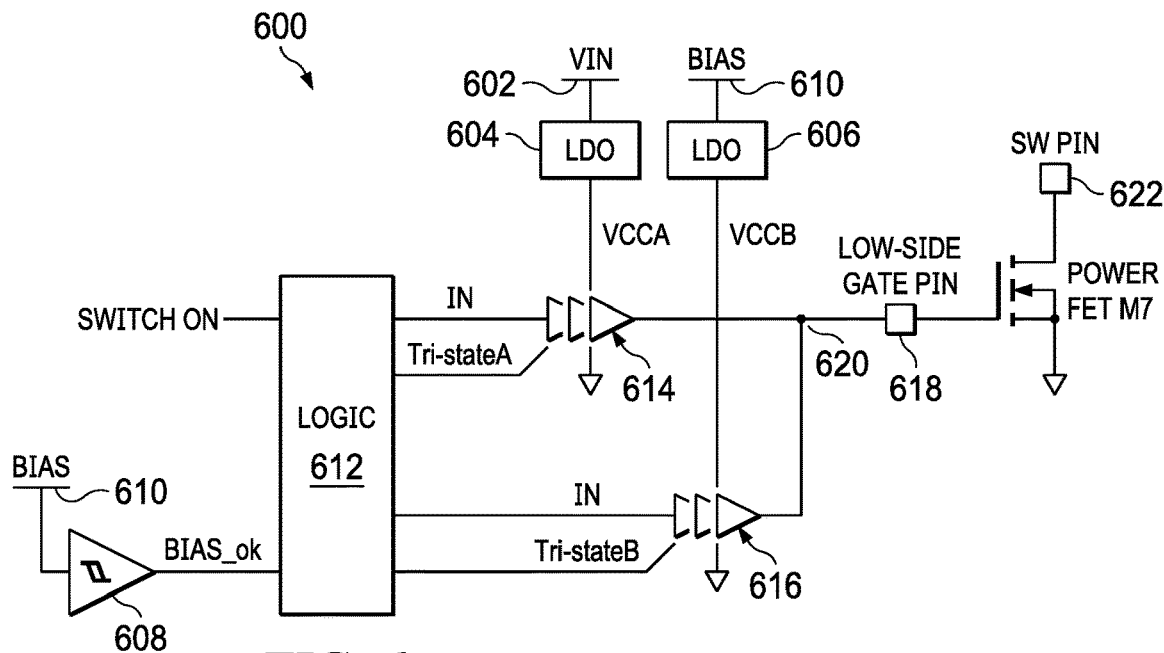
FIG. 6 is a schematic diagram showing another dual supply gate driver in accordance with some examples.

FIG. 6 is a schematic diagram showing another dual supply gate driver 600 in accordance with some examples. As shown, the dual supply gate driver circuit 600 comprises a first driver circuit 614 and a second driver circuit 616, where the output nodes of the first driver circuit 614 and the second driver circuit 616 are coupled to a drive signal node 620. In the example of FIG. 6, M7 has its control terminal coupled to the drive signal node 620 via a low-side gate pin 618. Also, the first current terminal of M7 is coupled to a switch node (SW) pin 622, and the second current terminal of M7 is coupled to a ground node.

In some examples, the dual supply gate driver circuit 600 comprises a single IC with driver components (e.g., the first and second driver circuits 614 and 616), driver control components (e.g., the controller logic 612 and other components), and a power transistor (e.g., M7). In other examples, the components represented for the dual supply gate driver circuit 600 correspond to multiple ICs (e.g., M7 is part of a first IC, while the driver components and driver control components are part of a second IC).

In the example of FIG. 6, the operations of the controller logic 612 (an example of the driver controller 112 in FIG. 1) for the dual supply gate driver circuit 600 are based on a control signal ("Switch ON") and a bias voltage level indicator signal ("BIAS_ok"). In some examples, the BIAS_ok signal is provided by a comparator 608, where the output of the comparator 608 indicates when the BIAS voltage at node 610 is greater than a threshold. When the BIAS voltage at node 610 is greater than the threshold, the controller logic 612 selects the second driver circuit 616 using a control signal ("Tri-stateB"), where the input signal (IN) to the second driver circuit 616 is buffered using a voltage supply signal (VCCB) based on the BIAS voltage available at node 610. In the example of FIG. 6, VCCB is provided low dropout regulator (LDO) circuit 606 coupled to the node 610 With the arrangement of FIG. 6, the VCCB voltage is based on the BIAS voltage at node 610 and is provided to the second driver circuit 616. When the BIAS voltage is sufficiently high, the controller logic 612 uses the second driver circuit 616 to provide the drive signal for M7.

When the BIAS voltage at node 610 is equal to or less than the threshold, the controller logic 612 selects the first driver circuit 614 using a control signal ("Tri-stateA"), where the input signal (IN) to the first driver circuit 614 is buffered using a voltage supply signal (VCCA) based on the VIN voltage available at node 602. In the example of FIG. 6, VCCA is provided by another LDO circuit 604 coupled to the node 602. With the arrangement of FIG. 6, the VCCA voltage is based on the VIN voltage at node 602 and is provided to the first driver circuit 614. When the BIAS voltage is not sufficiently high, the controller logic 612 uses the first driver circuit 614 to provide the drive signal for M7. With the arrangement of FIG. 6, the dual supply gate driver circuit 600 increases complexity compared to a single driver arrangement with the benefit of reducing power consumption (by using the BIAS voltage for power driver operations when the BIAS voltage is sufficiently high) for low-side switch drive operations.

Figure 7:
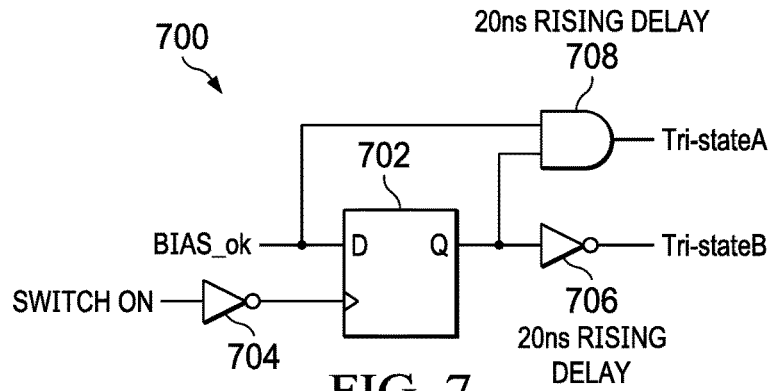
FIG. 7 is a schematic diagram showing controller logic for a dual supply gate driver in accordance with some examples.

FIG. 7 is a schematic diagram showing controller logic 700 for a dual supply gate driver (e.g., the dual supply gate driver circuits 500 or 600 of FIGS. 5 and 6) in accordance with some examples. The controller logic 700 of FIG. 7 is an example of the driver controller 112 of FIG. 1, the controller logic 512 of FIG. 5, or the controller logic 612 of FIG. 6. As shown, the controller logic 700 includes a D latch 702, where the D input node receives the BIAS_ok signal. Also, a reset node of the D latch 702 receives the Switch ON signal via an inverter 704. The controller logic 700 also includes an AND gate 708 that receives the BIAS_ok signal and the output of the D latch 702. When the BIAS_ok signal is high and the output of the D latch 702 is high, the Tri-stateA signal is high which disables the driver. Also, when the output of the D latch 702 is low, the Tri-stateB signal is high due to inverter 706, which disables the driver. In the example of FIG. 7, the AND gate 708 and the inverter 706 have a 20 ns rising delay. In other examples, the rising delay may vary (the delay ensures some overlap in the control signal to avoid an undefined state).

Figure 8:
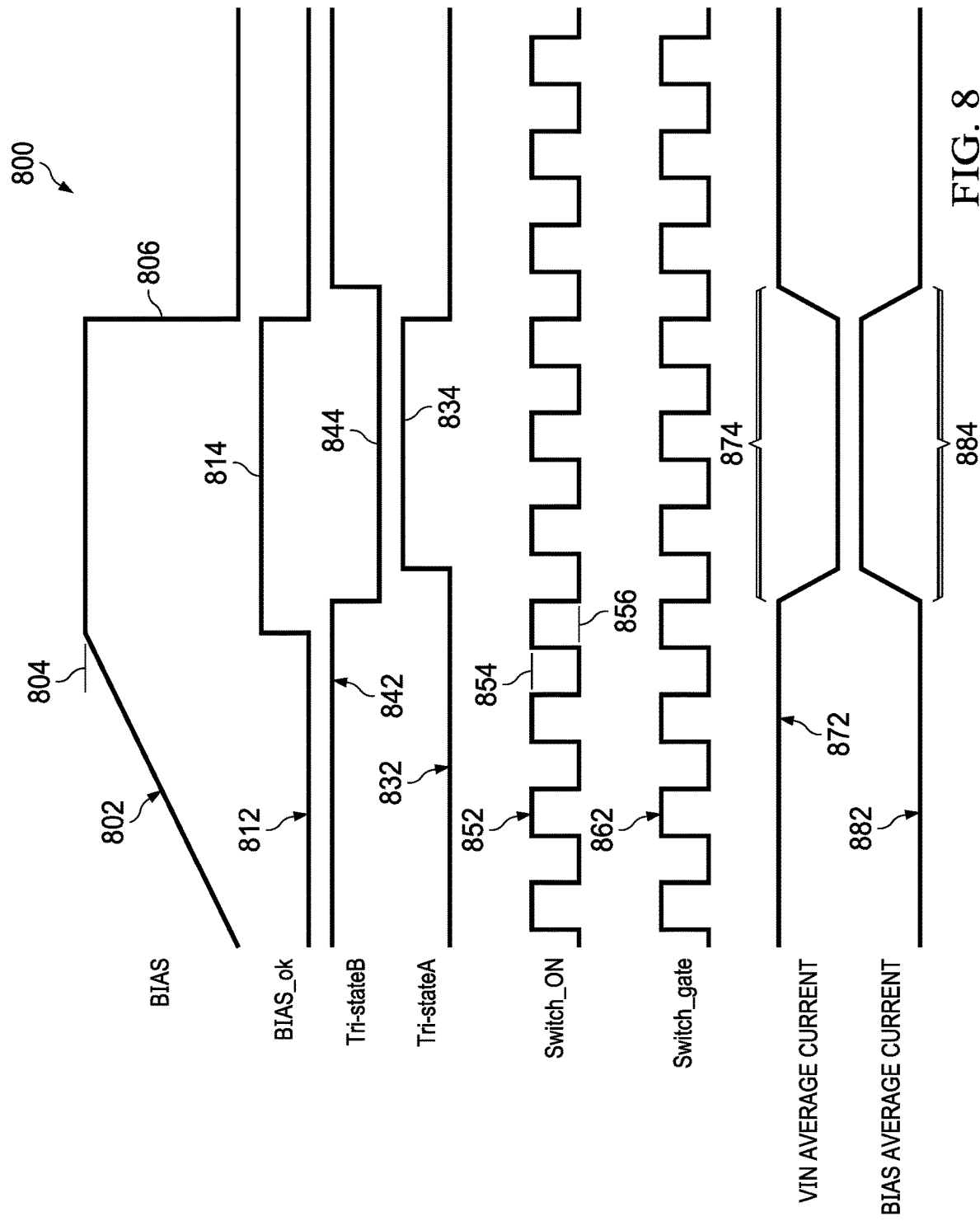
FIG. 8 is a timing diagram showing various waveforms related to a dual supply gate driver in accordance with some examples.

FIG. 8 is a timing diagram 800 showing various waveforms related to a dual supply gate driver in accordance with some examples. As shown, the timing diagram 800 includes a bias input waveform 802, a bias_ok waveform 812, a Tri-stateA waveform 842, a Tri-stateB waveform 832, a Switch_ON waveform 852, a Switch_gate waveform 862 (corresponding to the gate signal for M7 at node 522 in FIG. 5, or node 620 in FIG. 6), a VIN average current waveform 872, and a bias average current waveform 882. Note: when switching between the drivers used to provide the Switch_gate waveform 862 (e.g., switching between first and second driver circuits 514 and 516 in FIG. 5; or switching between first and second driver circuits 614 and 616 in FIG. 6), there is no interruption to the Switch_gate signal which follows the Switch_ON waveform 852. In practice, the Switch_gate signal would be slightly delayed relative to the Switch_ON signal.

In the timing diagram 800, the value of the bias_ok signal goes high during an interval 814 when the bias input reaches a threshold 804 as represented by the waveforms 802 and 812. Also, Tri-stateA goes high during an interval 834 when the bias_ok signal goes high as represented by the waveforms 812 and 832. Also, Tri-stateB stays low during the interval 814 as represented by the waveforms 812 and 842. During the interval 834, the average VIN current drops to zero for an interval 874 as represented by the waveforms 832 and 872. During the interval 834, the average current increases for an interval 884 as represented by the waveforms 832 and 882. At time 806, the bias input drops below the threshold 804, resulting in the bias_ok signal going low as represented by the waveforms 802 and 812. As represented in the timing diagram 800, the Switch_ON waveform 852 shows transitions between a high value 854 and a low value 856, where these transitions are not affected by the other values represented for the timing diagram 800. As shown, the Switch_gate waveform 852 follows the pattern of the Switch_ON waveform 852.

In some examples, the BIAS current maximum is less than the VIN current maximum (e.g., lower by several mA). In the disclosed driver topologies, selective use of dual drivers is implemented to improve efficiency of providing a drive signal (e.g., a low-side drive signal). The improvement in efficiency is due to the BIAS current being lower than the VIN current, which can be leveraged to reduce overall power consumption in a dual supply gate driver circuit (e.g., the dual supply gate driver circuits 500 or 600 of FIGS. 5 and 6) instead of single supply gate driver circuit. Also, the disclosed driver topologies avoid an external capacitor for drive operations to reduce the size and cost of the dual supply gate driver circuits described herein.

Figure 9:
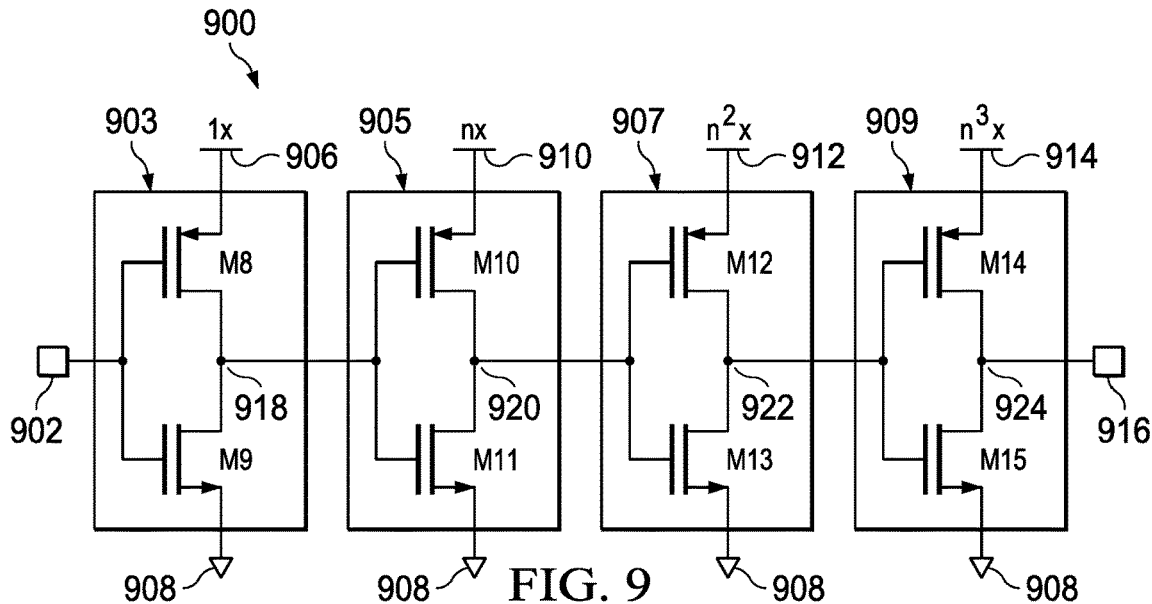
FIG. 9 is a schematic diagram showing a driver circuit in accordance with some examples.

FIG. 9 is a schematic diagram showing a driver circuit 900 (an example of the first driver circuit 514 in FIG. 5, the second driver circuit 516 in FIG. 5, the first driver circuit 614 in FIG. 6, or the second driver circuit 616 in FIG. 6). As shown, the driver circuit 900 comprises a plurality of inverter circuits 903, 905, 907, and 909 in series between an input node 902 and an output node 916. More specifically, the first inverter circuit 903 includes two transistors, M8 and M9, coupled between a first input supply node 906 and a ground node 908. As shown, the first current terminal of M8 is coupled to the first input supply node 906 (e.g., to receive an input voltage of 1x, where x is a reference voltage level), the second current terminal of M8 is coupled to the first current terminal of M9, and the second current terminal of M9 is coupled to the ground node 908. Meanwhile, the control terminals for M8 and M9 are coupled to the input node 902.

As shown, the second inverter circuit 905 includes two transistors, M10 and M11, coupled between a second input supply node 910 and the ground node 908. More specifically, the first current terminal of M10 is coupled to the second input supply node 910 (e.g., to receive an input voltage of nx, where n is an integer value greater than 1, and where x is a reference voltage level), the second current terminal of M10 is coupled to the first current terminal of M11, and the second current terminal of M11 is coupled to the ground node 908. Meanwhile, the control terminals for M10 and M11 are coupled to the output node 918 of the first inverter circuit 903.

As shown, the third inverter circuit 907 includes two transistors, M12 and M13, coupled between a third input supply node 912 and the ground node 908. More specifically, the first current terminal of M12 is coupled to the third input supply node 912 (e.g., to receive an input voltage of $n^2x$, where n is an integer value greater than 1, and where x is a reference voltage level), the second current terminal of M12 is coupled to the first current terminal of M13, and the second current terminal of M13 is coupled to the ground node 908. Meanwhile, the control terminals for M12 and M13 are coupled to the output node 920 of the second inverter circuit 905.

As shown, the fourth inverter circuit 909 includes two transistors, M14 and M15, coupled between a fourth input supply node 914 and the ground node 908. More specifically, the first current terminal of M14 is coupled to the fourth input supply node 914 (e.g., to receive an input voltage of $n^3x$, where n is an integer value greater than 1, and where x is a reference voltage level), the second current terminal of M14 is coupled to the first current terminal of M15, and the second current terminal of M15 is coupled to the ground node 908. Meanwhile, the control terminals for M14 and M15 are coupled to the output node 922 of the second inverter circuit 905. As shown, the output node 924 for the fourth inverter circuit 909 is coupled to the output node 916 for the driver circuit 916.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A system, comprising:
   a first regulator having a first voltage input and a first voltage output;
   a second regulator having a second voltage input and a second voltage output;
   a first driver circuit coupled to the first regulator and a switch, wherein the first driver circuit is configured to drive the switch based on a first output voltage at the first voltage output;
   a second driver circuit coupled to the second regulator and the switch, wherein the second driver circuit is configured to drive the switch based on a second output voltage at the second voltage output;
   a driver controller coupled to the first driver circuit and the second driver circuit, wherein the driver controller is configured to select one of the first driver circuit and the second driver circuit to drive the switch based on a control signal; and
   a switch node coupled to the switch, wherein a switch node voltage at the switch node is a function of the switch being turned on and off.

2. The system of claim 1, further comprising a voltage monitoring circuit configured to monitor a second input voltage at the second voltage input and to provide the control signal to the driver controller.

3. The system of claim 2, wherein the driver controller is configured to select the second driver circuit when the control signal indicates that the second input voltage is greater than a threshold.

4. The system of claim 2, wherein the driver controller is configured to select the first driver circuit when the control signal indicates that the second input voltage is equal to or less than a threshold.

5. The system of claim 1, wherein the switch node is configured to be coupled to a load.

6. The system of claim 1, further comprising a resistor coupled between an output node of the first regulator and an output node of the second regulator.

7. The system of claim 6, further comprising a sense switch coupled to the resistor and configured to receive an average of the first and second output voltages.

8. A circuit, comprising:
   a first regulator having a first voltage input and a first voltage output;
   a second regulator having a second voltage input and a second voltage output, wherein a second input voltage at the second voltage input is less than a first input voltage at the first voltage input;

a first driver circuit coupled to the first voltage output and having a first gate drive signal output;

a second driver circuit coupled to the second voltage output and having a second gate drive signal output; and a driver controller coupled to the first driver circuit and the second driver circuit, the driver controller is configured to output either the first gate drive signal or the second drive signal.

9. The circuit of claim 8, further comprises a voltage monitoring circuit configured to monitor the second input voltage and to provide a control signal to the driver controller.

10. The circuit of claim 9, wherein the driver controller is configured to select the second driver circuit to provide the second gate drive signal when the control signal indicates that the second input voltage is greater than a threshold.

11. The circuit of claim 9, wherein the driver controller is configured to select the first driver circuit to provide the second gate drive signal when the control signal indicates that the second input voltage is less than a threshold.

12. The circuit of claim 8, further comprising a low-side switch coupled to the drive signal node.

13. The circuit of claim 8, further comprising:

a resistor coupled between an output node of the first regulator and an output node of the second regulator; and a sense switch coupled to the resistor and configured to receive an average of the first and second output voltages.

14. A dual supply gate driver, comprising:

a first regulator circuit configured to receive a first input voltage;

a second regulator circuit configured to receive a second input voltage;

a first driver circuit coupled to an output of the first regulator circuit;

a second driver circuit coupled to an output of the second regulator circuit; and a driver controller coupled to the first driver circuit and the second driver circuit;

wherein the dual supply gate driver includes an output coupled to an output of the first driver circuit and to an output of the second driver circuit.

15. The dual supply gate driver of claim 14, further comprises a voltage monitoring circuit configured to receive the second input voltage and to output a control signal to the driver controller.

16. The dual supply gate driver of claim 15, wherein the driver controller is configured to select the second driver circuit to provide a gate drive signal at the output of the dual supply gate driver when the control signal from the voltage monitoring circuit indicates that the second input voltage is greater than a threshold.

17. The dual supply gate driver of claim 15, wherein the driver controller is configured to select the first driver circuit to provide a gate drive signal at the output of the dual supply gate driver when the control signal from the voltage monitoring circuit indicates that the second input voltage is equal to or less than a threshold.

18. The dual supply gate driver of claim 14, wherein the first regulator circuit comprises a first transistor with a control terminal, a first current terminal, and a second current terminal, the first current terminal of the first transistor is coupled to the first input voltage, the control terminal of the first transistor is coupled to a current source, and the second current terminal of the first transistor is coupled to the first driver circuit and to a first end of a resistor.

19. The dual supply gate driver of claim 18, wherein the second regulator circuit comprises a second transistor with a control terminal, a first current terminal, and a second current terminal, the first current terminal of the second transistor is coupled to the second input voltage, the control terminal of the second transistor is coupled to the current source, and the second current terminal of the second transistor is coupled to the second driver circuit and to a second end of the resistor.

20. The dual supply gate driver of claim 14, wherein the first input voltage is higher than the second input voltage.

* * * * *